United States Patent [19]
Cable

[11] Patent Number: 5,304,840
[45] Date of Patent: Apr. 19, 1994

[54] CRYOGENIC RADIATION-HARD DUAL-LAYER FIELD OXIDE FOR FIELD-EFFECT TRANSISTORS

[75] Inventor: James S. Cable, Redondo Beach, Calif.

[73] Assignee: TRW Inc., Redondo Beach, Calif.

[21] Appl. No.: 919,659

[22] Filed: Jul. 24, 1992

[51] Int. Cl.$^5$ .................. H01L 29/34; H01L 27/02
[52] U.S. Cl. .................. 257/640; 257/288; 257/639; 257/641; 257/644; 257/649; 257/650
[58] Field of Search ............. 257/637, 639, 640, 641, 257/644, 649, 650, 288

[56] References Cited

U.S. PATENT DOCUMENTS

| | | | |
|---|---|---|---|
| 3,967,310 | 6/1976 | Horiuchi et al. | 257/637 |
| 4,051,273 | 9/1977 | Abbas et al. | 257/637 |
| 4,356,042 | 10/1982 | Gedaly et al. | 257/637 |
| 4,485,393 | 11/1984 | Kumamaru et al. | 257/640 |
| 4,543,707 | 10/1985 | Ito et al. | 257/637 |

FOREIGN PATENT DOCUMENTS

| | | | |
|---|---|---|---|
| 58-77260 | 5/1983 | Japan | 257/637 |
| 63-62380 | 3/1988 | Japan | 257/640 |
| 1-122139 | 5/1989 | Japan | 257/637 |
| 2-278725 | 11/1990 | Japan | 257/644 |
| 91/11827 | 8/1991 | PCT Int'l Appl. | 257/637 |

Primary Examiner—Ngan Ngo
Attorney, Agent, or Firm—Ronald L. Taylor

[57] ABSTRACT

A cryogenic radiation-hard dual-layer field oxide of reoxidized nitrided oxide (ONO) which provides radiation hardness for field-effect transistors and other semiconductor devices at cryogenic temperatures. The dual-layer field oxide includes a thin lower dielectric layer of reoxidized nitrided oxide and an upper deposited dielectric layer that remains charge neutral. The upper dielectric layer is preferably silicon nitride or a doped oxide, such as phospho silicate glass or boro phospho silicate glass. The lower dielectric layer can be made very thin since reoxidized nitrided oxide is a much better barrier layer to the diffusion of boron or phosphorous from the upper dielectric layer into the silicon substrate than silicon dioxide. A thin lower dielectric layer allows only a small amount of positive charge buildup, while the upper dielectric layer traps both holes and electrons and remains charge neutral.

17 Claims, 1 Drawing Sheet

CRYOGENIC RADIATION-HARD DUAL-LAYER FIELD OXIDE FOR FIELD-EFFECT TRANSISTORS

BACKGROUND OF THE INVENTION

This invention relates generally to radiation-hard semiconductor devices and, more particularly, to radiation-hard field-effect transistors that remain radiation hard at cryogenic temperatures.

Semiconductor infrared photodetectors are often arranged in focal plane arrays and cryogenically cooled to very low temperatures to provide sensitive detection of infrared radiation for various types of space-based sensor systems. For example, a common infrared focal plane array design employs a hybrid configuration having a semiconductor infrared photodetector array and a semiconductor multiplexer array. The photodetector and multiplexer arrays are fabricated as separate electronic components to allow each semiconductor array to be individually optimized for a particular application. The multiplexer array operates in the cryogenically cooled environment of the photodetector array and utilizes metal-oxide semiconductor field-effect transistors (MOSFETs) to provide a read out of the detector signals.

For sensitive infrared detection in the harsh radiation environment of space, the MOS field-effect transistors must be radiation hard at cryogenic temperatures and operate with low noise, high dynamic range and low power dissipation. Radiation hardness is required in order to prevent a radiation-induced buildup of positive charges at the interface between the silicon substrate and a silicon dioxide ($SiO_2$) dielectric layer formed on the surface of the substrate for passivation. This positive charge buildup forms an inversion layer which induces a leakage current that often destroys the isolation properties of the transistor.

Radiation hardness is ordinarily achieved through the use of either a radiation-hard field oxide or a p+ guard ring. Unfortunately, conventional radiation-hard field oxides lose much of their radiation hardness at cryogenic temperatures and p+ guard rings impose a large density penalty, degrade transistor performance, and require extra fabrication steps. Accordingly, there has been a need for a field-effect transistor that is radiation hard at cryogenic temperatures and is suitable for high density applications. The present invention is directed to this end.

SUMMARY OF THE INVENTION

The present invention resides in a cryogenic radiation-hard dual-layer field oxide of reoxidized nitrided oxide (ONO) which provides radiation hardness for field-effect transistors and other semiconductor devices at cryogenic temperatures. The dual-layer field oxide includes a thin lower dielectric layer of reoxidized nitrided oxide and an upper deposited dielectric layer that remains charge neutral. The upper dielectric layer is preferably silicon, nitride or a doped oxide, such as phospho silicate glass or boro phospho silicate glass. The lower dielectric layer can be made very thin since reoxidized nitrided oxide is a much better barrier layer to the diffusion of boron or phosphorous from the upper dielectric layer into the silicon substrate than silicon dioxide. A thin lower dielectric layer allows only a small amount of positive charge buildup, while the upper dielectric layer traps both holes and electrons and remains charge neutral.

It will be appreciated from the foregoing that the present invention represents a significant advance in the field of radiation-hard semiconductor devices. Other features and advantages of the present invention will become apparent from the following more detailed description, taken in conjunction with the accompanying drawings, which illustrate, by way of example, the principles of the invention.

DETAILED DESCRIPTION OF THE PREFERRED EMBODIMENT

Figure 1:
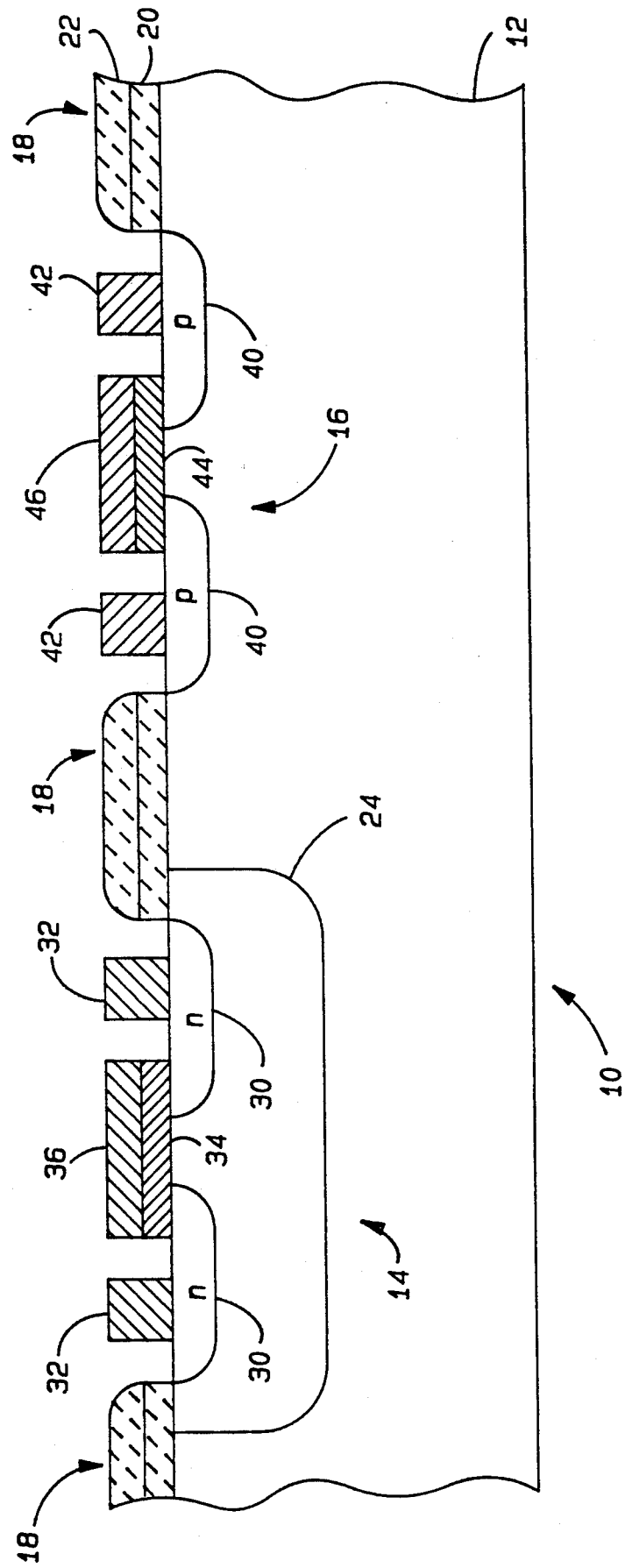
FIG. 1 illustrates a CMOS field-effect transistor employing the cryogenic radiation-hard dual-layer field oxide of the present invention.

As shown in the drawings for purposes of illustration, the present invention is embodied in a cryogenic radiation-hard dual-layer field oxide of re-oxidized nitrided oxide (ONO) which provides radiation hardness for field-effect transistors and other semiconductor devices at cryogenic temperatures. The dual-layer field oxide includes a thin lower dielectric layer of reoxidized nitrided oxide and an upper deposited dielectric layer that remains charge neutral. The upper dielectric layer is preferably silicon nitride or a doped oxide, such as phospho silicate glass or boro phospho silicate glass. The lower dielectric layer can be made very thin since reoxidized nitrided oxide is a much better barrier layer to the diffusion of boron or phosphorous from the upper dielectric layer into the silicon substrate than silicon dioxide. A thin lower dielectric layer allows only a small amount of positive charge buildup, while the upper dielectric layer traps both holes and electrons and remains charge neutral.

FIG. 1 illustrates a pair of complementary metal-oxide semiconductor (CMOS) field-effect transistors 10 employing the cryogenic radiation-hard dual-layer field oxide of the present invention. The CMOS field-effect transistors 10 include an n-doped silicon substrate 12, an n-channel MOS field-effect transistor 14 formed on the substrate, a p-channel MOS field-effect transistor 16 formed on the substrate 12 adjacent to the n-channel field-effect transistor 14, and a cryogenic radiation-hard dual-layer field oxide 18 formed on the remainder of the substrate 12.

The dual-layer field oxide 18 includes a thin lower dielectric layer 20 of reoxidized nitrided oxide and an upper deposited dielectric layer 22 that remains charge neutral. The upper dielectric layer 22 is preferably silicon nitride ($Si_3N_4$) or a doped oxide, such as phospho silicate glass (PSG) or boro phospho silicate glass (BPSG). The lower dielectric layer 20 can be made very thin since reoxidized nitrided oxide is a much better barrier layer to the diffusion of boron or phosphorous from the upper dielectric layer 22 into the silicon substrate 12 than silicon dioxide ($SiO_2$). A thin lower dielectric layer 20 allows only a small amount of positive charge buildup, while the upper dielectric layer 22 traps both holes and electrons and remains charge neutral.

This is in contrast to a conventional radiation-hard field oxide, which provides radiation hardness by generating interface states at a faster rate than trapped holes. Therefore, the conventional field oxide generates an excess of negative charges which offsets the radiation-induced positive charges, thus reducing the field shift caused by the radiation. However, at cryogenic temperatures, the generation of interface states is suppressed due to the immobilization of the holes at the low temperatures.

As shown in FIG. 1, the n-channel MOS transistor 14 is an enhancement-mode field-effect transistor which is formed on a p-doped well 24 to isolate the n-channel transistor 14 from the n-doped substrate 12. The n-channel field-effect transistor 14 includes a pair of n-doped wells 30 formed on the p-doped well 24, a pair of metal contacts 32 formed on the n-doped wells 30, a metal oxide layer 34 formed on the p-doped well 24 between the n-doped wells 30, and a metal contact 36 formed on the metal oxide layer 34. The n-doped wells 30 form the drain and source of the n-channel field-effect transistor 14, the metal contacts 32 form the drain and source contacts, the metal oxide layer 34 forms the gate of the field-effect transistor 14, and the metal contact 36 forms the gate contact.

The p-channel MOS transistor 16 is also an enhancement-mode field-effect transistor and includes a pair of p-doped wells 40 formed on the n-doped substrate 12, a pair of metal contacts 42 formed on the p-doped wells 40, a metal oxide layer 44 formed on the substrate 12 between the p-doped wells 40, and a metal contact 46 formed on the metal oxide layer 44. The p-doped wells 40 form the drain and source of the p-channel field-effect transistor 16, the metal contacts 42 form the drain and source contacts, the metal oxide layer 44 forms the gate of the field-effect transistor 16, and the metal contact 46 forms the gate contact.

The CMOS field-effect transistors 10 of the present invention are fabricated using conventional semiconductor fabrication processes. The reoxidized nitrided oxide is silicon dioxide that has been annealed in high temperature ammonia and then reoxidized in oxygen. The lower dielectric layer 20 is thermally grown and has a thickness of about 150 to 250 Å. This is to be compared with a conventional layer of silicon dioxide, which usually has a thickness of about 600 to 1000 Å. The upper dielectric layer 22 is a deposited oxide and has a thickness of about 1000 to 5000 Å.

From the foregoing, it will be appreciated that the present invention represents a significant advance in the field of radiation-hard semiconductor devices. Although a preferred embodiment of the invention has been shown and described, it will be apparent that other adaptations and modifications can be made without departing from the spirit and scope of the invention. Accordingly, the invention is not to be limited, except as by the following claims.

I claim:

1. A cryogenic radiation-hard dual-layer field oxide, comprising;
   a thin lower dielectric layer of reoxidized nitrided oxide, said lower dielectric layer having a thickness; and
   an upper deposited dielectric layer that remains charge neutral, said upper dielectric layer having a thickness.

2. The cryogenic radiation-hard dual-layer field oxide a set forth in claim 1, wherein the upper dielectric layer is phospho silicate glass (PSG).

3. The cryogenic radiation-hard dual-layer field oxide as set forth in claim 1, wherein the upper dielectric layer is boro phospho silicate glass (BPSG).

4. The cryogenic radiation-hard dual-layer field oxide a set forth in claim 1, wherein the upper dielectric layer is silicon nitride ($Si_3N_4$).

5. The cryogenic radiation-hard dual-layer field oxide as set forth in claim 1, wherein the thickness of the lower dielectric layer is approximately 150 to 250 Å and the thickness of the upper dielectric layer is approximately 1000 to 5000 Å.

6. A cryogenic radiation-hard field-effect transistor, comprising;
   a semiconductor substrate;
   a field-effect transistor formed on a portion of the substrate; and
   a cryogenic radiation-hard dual-layer field oxide formed on the remaining portion of the substrate;
   wherein the dual-layer field oxide includes a thin lower dielectric layer of reoxidized nitrided oxide, said lower dielectric layer having a thickness, and an upper deposited dielectric layer that remains charge neutral, said upper dielectric layer having a thickness.

7. The cryogenic radiation-hard field-effect transistor as set forth in claim 6, wherein the field-effect transistor is an n-channel metal-oxide semiconductor field-effect transistor.

8. The cryogenic radiation-hard field-effect transistor as set forth in claim 6, wherein the field-effect transistor is a p-channel metal-oxide semiconductor field-effect transistor.

9. The cryogenic radiation-hard field-effect transistor as set forth in claim 6, wherein the upper dielectric layer is phospho silicate glass (PSG).

10. The cryogenic radiation-hard field-effect transistor as set forth in claim 6, wherein the upper dielectric layer is boro phospho silicate glass (BPSG).

11. The cryogenic radiation-hard field-effect transistor as set forth in claim 6, wherein the upper dielectric layer is silicon nitride ($Si_3N_4$).

12. The cryogenic radiation-hard field-effect transistor as set forth in claim 6, wherein the thickness of the lower dielectric layer is approximately 150 to 250 Å and the thickness of the upper dielectric layer is approximately 1000 to 5000 Å.

13. A cryogenic radiation-hard semiconductor device, comprising;
   a semiconductor substrate;
   a semiconductor device formed on a portion of the substrate; and
   a cryogenic radiation-hard dual-layer field oxide formed on the remaining portion of the substrate;
   wherein the dual-layer field oxide includes a thin lower dielectric layer of reoxidized nitride oxide, said lower dielectric layer having a thickness and an upper deposited dielectric layer that remains charge neutral, said upper dielectric layer having a thickness.

14. The cryogenic radiation-hard semiconductor device as set forth in claim 13, wherein the upper dielectric layer is phospho silicate glass (PSG).

15. The cryogenic radiation-hard semiconductor device as set forth in claim 13, wherein the upper dielectric layer is boro phospho silicate glass (BPSG).

16. The cryogenic radiation-hard semiconductor device as set forth in claim 13, wherein the upper dielectric layer is silicon nitride ($Si_3N_4$).

17. The cryogenic radiation-hard semiconductor device as set forth in claim 13, wherein the thickness of the lower dielectric layer is approximately 150 to 250 Å and the thickness of the upper dielectric layer is approximately 1000 to 5000 Å.

* * * * *